US010354022B2

(12) United States Patent
Hu et al.

(10) Patent No.: US 10,354,022 B2
(45) Date of Patent: Jul. 16, 2019

(54) VISUAL EFFICACY DETERMINING METHOD FOR NON-COLOURED OBJECTS IN DIFFERENT LIGHT ENVIRONMENTS AND SYSTEM THEREOF

(71) Applicants: Beijing University Of Technology, Beijing (CN); Guizhou Expressway Group Co., LTD., Guizhou (CN)

(72) Inventors: Jiangbi Hu, Beijing (CN); Xiaoqin Zhang, Beijing (CN); Yuanfeng Zhang, Beijing (CN); Xiaoyu Li, Beijing (CN); Guiping Guan, Beijing (CN); Weili Wang, Beijing (CN); Wenqian Ma, Beijing (CN); Da Guo, Beijing (CN); Meng Wang, Beijing (CN); Feng Liu, Beijing (CN); Xiaojuan Gao, Beijing (CN); Linxi Gao, Beijing (CN)

(73) Assignees: BEIJING UNIVERSITY OF TECHNOLOGY (CN), Beijing (CN); GUIZHOU EXPRESSWAY GROUP CO., LTD (CN), Guizhou (CN)

( * ) Notice: Subject to any disclaimer, the term of this patent is extended or adjusted under 35 U.S.C. 154(b) by 0 days.

(21) Appl. No.: 15/524,751

(22) PCT Filed: Oct. 15, 2015

(86) PCT No.: PCT/CN2015/091961
§ 371 (c)(1),
(2) Date: May 5, 2017

(87) PCT Pub. No.: WO2016/078490
PCT Pub. Date: May 26, 2016

(65) Prior Publication Data
US 2017/0337297 A1 Nov. 23, 2017

(30) Foreign Application Priority Data
Nov. 18, 2014 (CN) .......................... 2014 1 0581835

(51) Int. Cl.
*G06K 9/00* (2006.01)
*G06F 17/50* (2006.01)
(Continued)

(52) U.S. Cl.
CPC ............. *G06F 17/50* (2013.01); *G01M 11/00* (2013.01); *G01M 11/005* (2013.01);
(Continued)

(58) Field of Classification Search
CPC ................ G01M 11/00; G01M 11/005; G06K 9/00624; G06F 17/50
See application file for complete search history.

(56) References Cited

U.S. PATENT DOCUMENTS

| 7,580,545 B2 | 8/2009 | Venkatesh | |
| 2007/0076958 A1* | 4/2007 | Venkatesh | G06K 9/00604 382/218 |
| 2009/0303078 A1* | 12/2009 | Mochizuki | B60W 40/02 340/901 |

FOREIGN PATENT DOCUMENTS

| CN | 103218484 A | 7/2013 |
| CN | 103383708 A | 11/2013 |

(Continued)

OTHER PUBLICATIONS

"Research and Application on the Measumment System of Lighting Visual Function in the Road and Tunnel"; Zhang Qingwen, Hu Yingkui, Weng Ji, Liu Yingying, Yang Chunyu, Liang Shuying; Key Laboratory of New Tehcnology for Construction of Cities in Mountain Area, Chongqing University, Chongqing; Sep. 20, 2012; pp. 9-13.

(Continued)

Primary Examiner — Avinash Yentrapati
(74) Attorney, Agent, or Firm — Taft Stettinius & Hollister LLP; Stephen F. Rost

(57) ABSTRACT

The present invention relates to a visual efficacy determining method for non-colored objects in different light environments, comprising: a) setting light environment; b) placing an object for performing visual recognition of a driver; c)

(Continued)

resetting the light environment, and repeating the step b); d) processing visual recognition information data obtained after experiments, and establishing a correlating relationship between visual recognition time and color temperature, color rendering index and brightness parameters of the light environment; and e) performing visual efficiency analysis according to the visual recognition information data processing results. The present invention further provides a system for implementing the visual efficacy determining method for non-colored objects in different light environments, wherein the system comprises a simulated tunnel middle section subsystem, a testing subsystem and a data processing subsystem. According to the method and the system disclosed by the present invention, visual efficacy analysis is performed on the visual influence of the light environment setting of the illumination of a night road and a tunnel middle section on the driver, and good guidance standards are provided for the reasonable and efficient setting of the color temperature, color rendering index and average brightness of a lighting device.

8 Claims, 5 Drawing Sheets

(51) Int. Cl.
    *G01M 11/00*      (2006.01)
    *H05B 33/08*      (2006.01)
    *H05B 37/02*      (2006.01)
(52) U.S. Cl.
    CPC ..... *G06K 9/00624* (2013.01); *H05B 33/0857* (2013.01); *H05B 37/02* (2013.01)

(56) References Cited

FOREIGN PATENT DOCUMENTS

| CN | 103383746 A | 11/2013 |
|---|---|---|
| CN | 103400198 A | 11/2013 |
| CN | 104296967 A | 1/2015 |

OTHER PUBLICATIONS

"Study on the Colour and Visibility of Tunnel Light Source"; College of Architecture and Urban Planning, Chonggqing University, Chongqing; Cui Lulu, Chen Zhonglin, Yin Ying; Jun. 11, 2008; pp. 8-12.
"Highway Tunnel Entrance Illumination Measurement Method Based on Physiological and Psychological Effects"; Zhang Qingqen, Tu Yun, Hu Yingkui, Weng Ji, Chen Jianzhong, Huang Ke; College of Archecture & Urban Planning, Chongqing University, Chongqing; Tunnel Engineering Department, China Merchants Chongqing Communications Research & Design Institute Co., Ltd. Chongqing; pp. 8-14; Apr. 2012; vol. 23, No. 2.
State Intellectual Property Office of the People's Republic of China; Notification of First Office Action, Application No. 201410581835. 0; dated May 5, 2016; pp. 1-11.
State Intellecutal Property Office of the People's Republic of China; Notification of Second Office Action, Application No. 201410581835. 0; dated Nov. 17, 2016; pp. 1-3.
European Patent Office, Munich, Germany; European Search Report, dated Feb. 11, 2017; pp. 1-6.
State Intellectual Property Office of the P.R. China, International Search Report and Written Opinion of the International Searching Authority for International Application No. PCT/CN2015/091961, dated Feb. 19, 2016, 11 Pages, Beijing, China.

\* cited by examiner

VISUAL EFFICACY DETERMINING METHOD FOR NON-COLOURED OBJECTS IN DIFFERENT LIGHT ENVIRONMENTS AND SYSTEM THEREOF

TECHNICAL FIELD

The present invention relates to the technical field of road tunnel lighting, and in particular to, a visual efficacy determining method for non-coloured objects in different light environments and a system thereof.

BACKGROUND

A night road or a road tunnel middle section is usually illuminated by an artificial light source which hardly influenced by natural light. As a result, in the course of driving at night or in the tunnel middle section, a driver will feel more visual and psychological loads relative to external environment. In order to improve the visual environment of the night road and the tunnel middle section, it is required that the light environment generated by the artificial light source can meet demands for the visual information collection and driving safety, stability and comfort of the driver when the driver drives the vehicle at a certain running speed on the night roads and in the tunnel middle section. Currently, how to determine the parameters, such as color temperature, color rendering and brightness parameter values of the artificial light source, with influence on the light environment to provide guidance standards for light environment setting to achieve a visual recognition level for safe and comfortable road driving has become a problem which has not been well solved.

At home and abroad, the evaluation of light environmental parameters of the night road and the tunnel middle section is mostly conducted according to subjective feelings of drivers or experts to qualitatively evaluate the brightness of the artificial light source or to evaluate the safety and comfort of the night road or tunnel middle section based on the driver's physical and psychological indexes, being lack of the study on driver's visual efficacy under different light source characteristics. Since the driver will have different visual perceptions in different light color environments with differences in needs of identification on objects, color temperature, color rendering, brightness level and other parameters of the light environments must be comprehensively expressed and analysed to comprehensively and objectively reflect the influence of the different light color environments on the driver's visibility. Thus, it is desirable to seek a determining method and system, which can comprehensively, objectively and simply reflect the influence of the different light color environments on the driver's visibility, which can analyse the driver's visibility under different light source characteristics, to obtain light environment parameters under the different light conditions so as to meet the driver's demand for visual recognition.

SUMMARY

In order to overcome the above-mentioned technical defects existing in the prior art, the present invention provides a light environment parameter standard determining method for a night road and a tunnel middle section, which is reliable in basis and simple to operate, and meets driving recognition requirements, and the present invention further provides a simple, reliable and highly-utilizable system for implementing the visual efficacy determining method in different light environments of the night road and the tunnel middle section based on visual recognition safety, so that the technical defects existing in the prior art that light environment parameter standards for the night road and the tunnel middle section are unreliable in basis and complex in test, and driver's psychological factors are not taken into account by results are overcome. Through comprehensive analysis on the parameters of color temperature, color rendering, brightness level and the like of the light environment, the light environment parameter indexes of different light environments, meeting the driver's needs of visual recognition, are obtained.

In order to solve the problems existing in the prior art, the first aspect of the present invention provides a visual efficacy determining method for non-coloured objects in different light environments, comprising the following steps:

(a) setting light environment parameters of a tunnel middle section, wherein the light environment parameters include color temperature T, color rendering index R and average brightness L, and selecting and setting a set of color temperature T, color rendering index R and average brightness L as the light environment parameters for testing;

(b) selecting a plurality of drivers to be tested at certain positions in a tunnel middle section for testing, and placing a non-coloured visual object in the tunnel middle section, wherein the visual object is a cube of which the side length is C, the distance between the position of the visual object and the position of the tested driver is D, and the tested driver's visual recognition height is H; and after each tested driver puts on a dynamic eye movement device which has been calibrated, starting to record an eye movement video, blocking the tested driver's front scene with an obstruction, randomly placing the visual object, removing the obstruction, instructing the tested driver to start to search and visually recognize the visual object, stopping the eye movement video recording after the visual recognition is completed, and recording the visual recognition results;

(c) resetting a different set of light environment parameters of color temperature, color rendering index and average brightness for the tunnel middle section, and repeating step (b) to obtain a plurality of drivers' related test information data and results under multiple sets of different light environmental parameters;

(d) analysing the tested driver's dynamic eye movement video acquired by the dynamic eye movement device to determine the number of frames in visual fixation points with which the driver captures the visual object, and determining visual recognition time of the driver visually recognizing the object under different light environmental characteristics with the number of frames of the visual object, and establishing a relationship between the visual recognition time and the color temperature, the color rendering index and the brightness parameter of the light environment by correlating the visual recognition information data; and (e) performing a visual efficacy analysis by analysing the relationship between the visual recognition time and the color temperature, the color rendering index and the brightness parameter of the light environment, to obtain light environmental parameter standards for improving the visual efficacy of non-coloured objects under certain combinations of the color temperature, color rendering index and light source brightness parameters.

The second aspect of the present invention provides a system for implementing the visual efficacy determining method for of non-coloured objects in different light environments, wherein the system comprises: a simulated tunnel middle section subsystem, comprising an adjustable lighting device mounted in a tunnel middle section, wherein light absorbing materials are arranged on the top surface, the left side surface and the right side surface of the simulated tunnel, obstructions for blocking visions are arranged at the simulated tunnel middle section, and diffuse reflection materials similar to an actual road surface are arranged on the road surface of the simulated tunnel so as to create a light environment and testing environment; a testing subsystem, comprising an non-coloured object, a spectral radiation measuring device, a brightness measuring device, a dynamic eye movement measuring device and a distance measuring device for performing testing, and collecting test data and results; and a data processing subsystem, comprising a computer system for fitting and processing the test data. In the method and the system disclosed by the present invention, through the merging and screening on information of the driver's driving visual recognition reactions and visual recognition effects on small objects during visual recognition in the tunnel middle section under different light environments created by lighting devices, light environmental guidance indexes are comprehensively proposed on the basis of enabling the driver's safe visual recognition in the tunnel middle section, from the driver's point of view, and the driver's visual demand characteristics are considered, thereby improving the accuracy in evaluation of safety of the light environment in the tunnel middle section; and at the same time, the method and the system are easy and simple to operate, and a reference is provided for light environment research of road traffic safety.

BRIEF DESCRIPTIONS OF THE DRAWINGS

The purposes, functions and advantages of the present invention will be apparent from the following description of embodiments of the present invention with reference to the accompanying drawings in which.

REFERENCE NUMERALS

100 tunnel middle section; 101 simulated tunnel middle section; 102 lighting device; 103 object; 104 tested driver; 105 obstruction.

DETAILED DESCRIPTION

The test of the present invention is carried out in a tunnel middle section and the result can be applied to the illumination setting of a night road as well because the environment of the night road is similar to that of the tunnel middle section.

Embodiment 1

Figure 1:
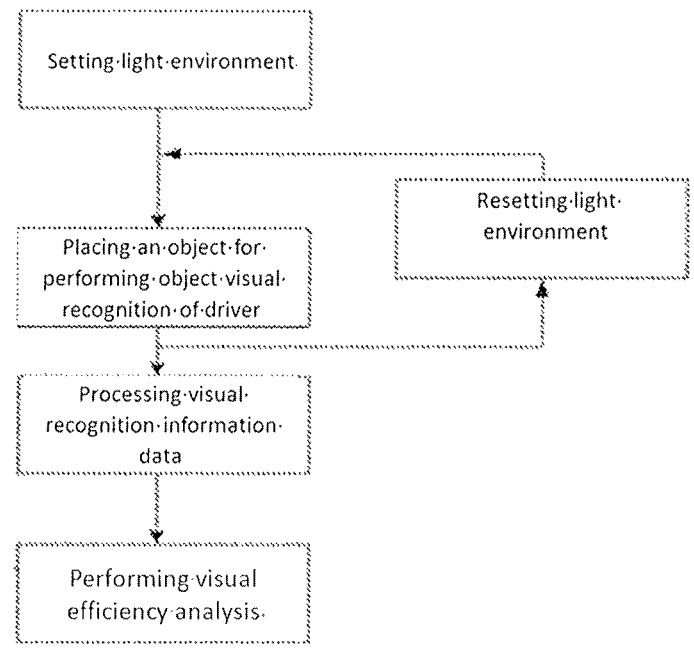
FIG. 1 is a flow chart of a visual efficacy determining method for non-coloured objects in a tunnel middle section in different light environments.
Figure 3:
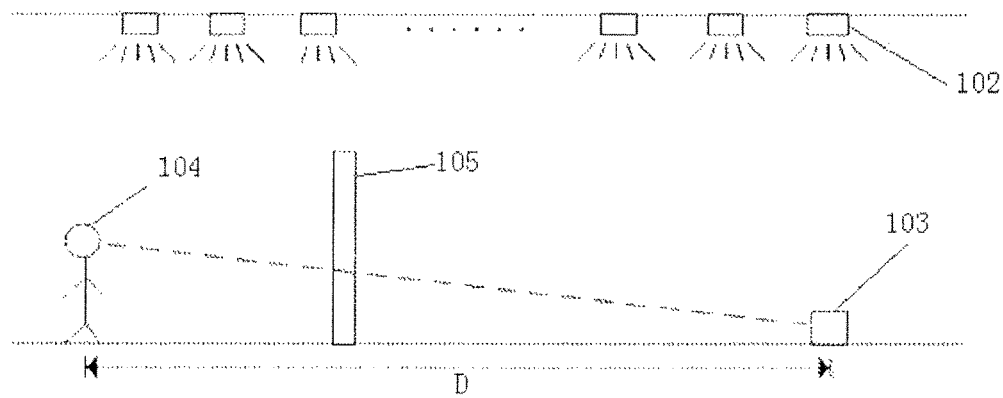
FIG. 3 is a test schematic diagram of the visual efficacy determining method for non-coloured objects in different light environments.
Figure 4:
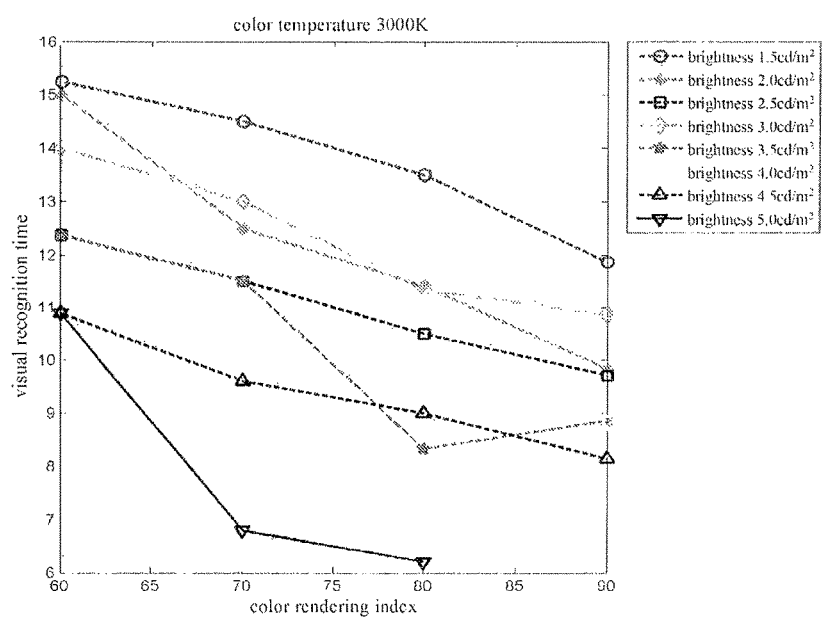
FIG. 4 is a data relationship curve of color rendering index-visual recognition time of different brightness under color temperature of 3000K.
Figure 5:
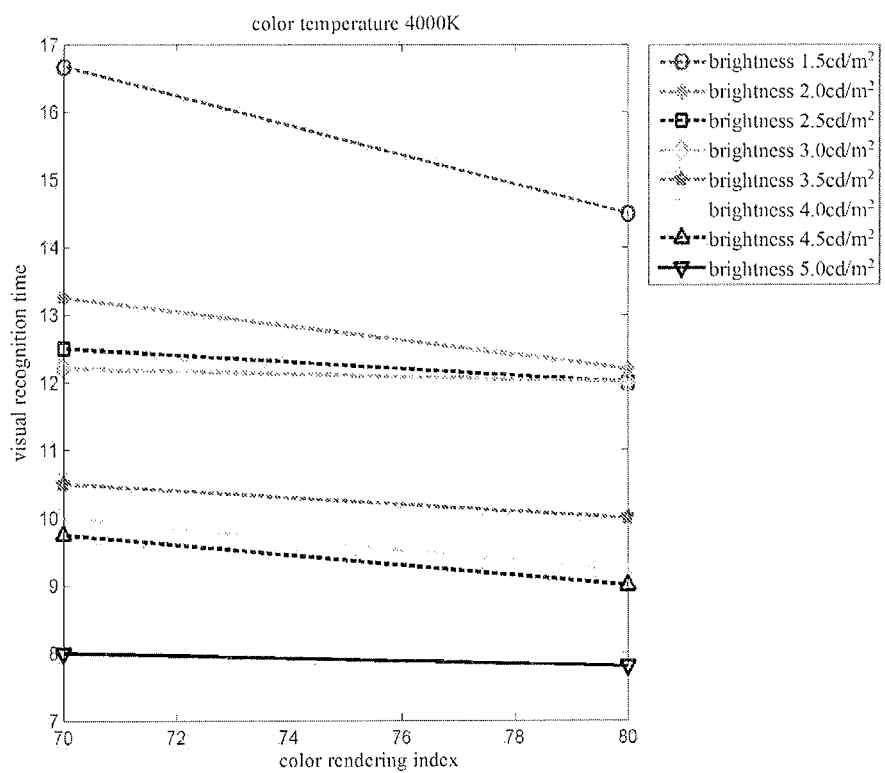
FIG. 5 is a data relationship curve of color rendering index-visual recognition time of different brightness under color temperature of 4000K.
Figure 6:
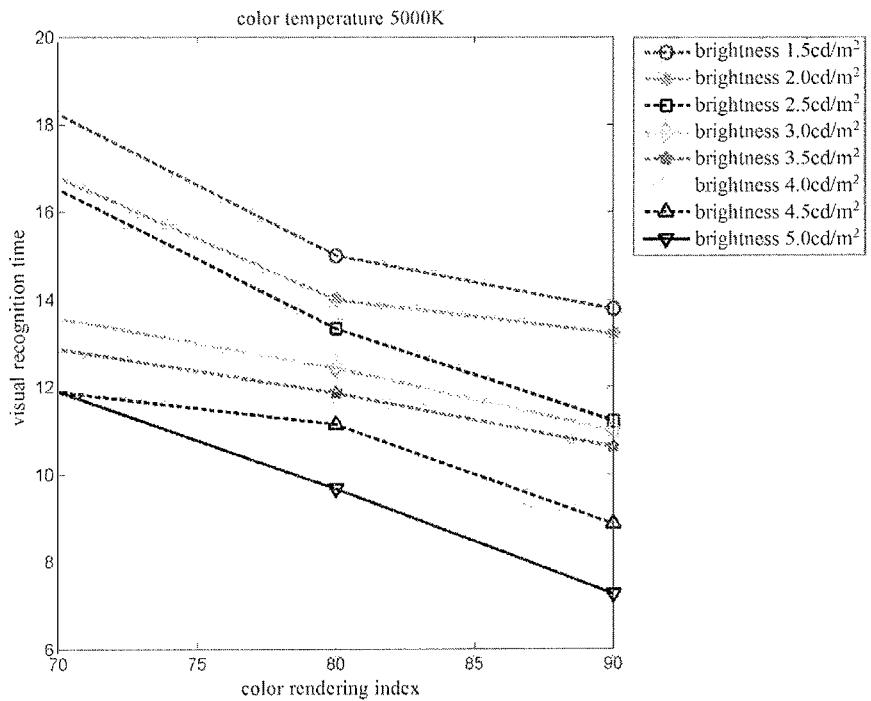
FIG. 6 is a data relationship curve of color rendering index-visual recognition time of different brightness under color temperature of 5000K.
Figure 7:
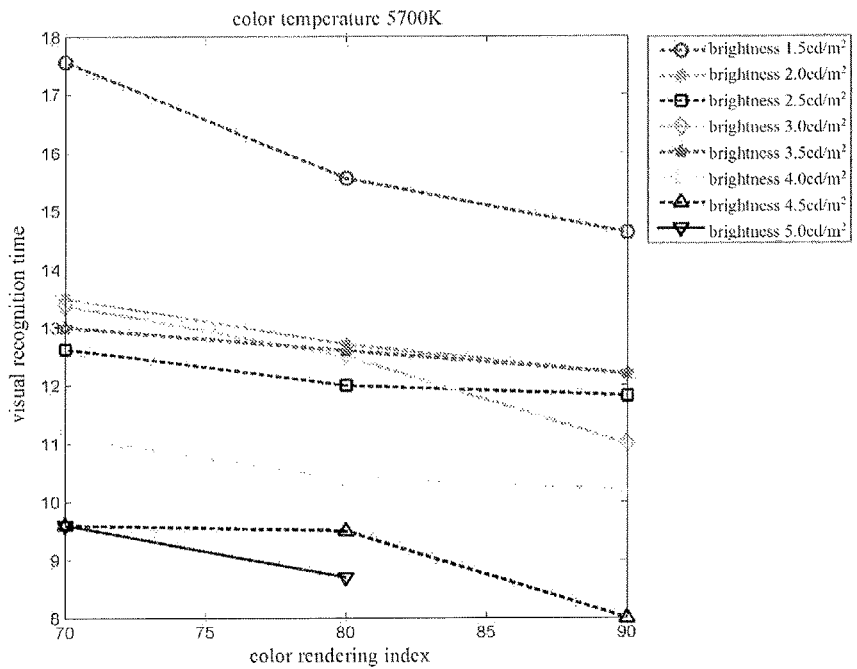
FIG. 7 is a data relationship curve of color rendering index-visual recognition time of different brightness under color temperature of 5700K.
Figure 8:
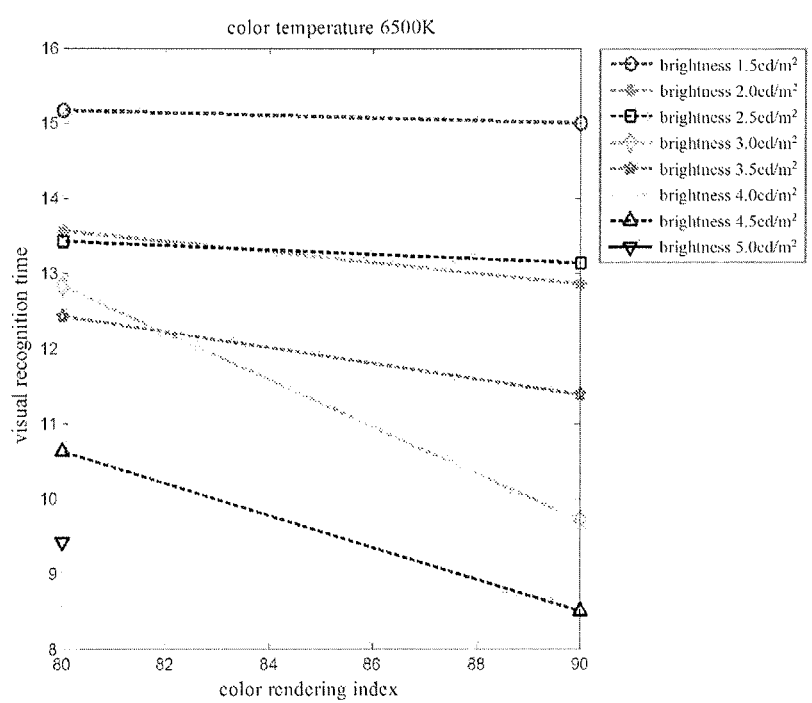
FIG. 8 is a data relationship curve of color rendering index-visual recognition time of different brightness under color temperature of 6500K.

FIG. 1 shows the flow chart of a visual efficacy determining method for non-coloured objects in a tunnel middle section in different light environments, provided by the present invention, and FIG. 3 shows a test schematic diagram of a visual efficacy determining method for non-coloured objects in different light environments, provided by the present invention. The present invention provides a visual efficacy determining method for non-coloured objects in different light environments, to determine the influence factors on the visual efficacy of the non-coloured objects in different light environments, and to ensure that the light environment setting according to the test results can meet the driver's visual recognition safety.

Referring to FIGS. 1 and 3, a visual determining method for non-coloured objects in a tunnel middle section in different light environments, disclosed by the present invention comprises the following steps:

step (a): setting light environmental parameters of the tunnel middle section, wherein the light environmental parameters include color temperature T, color rendering index Ra and average brightness L; in the determining test, possibly setting different color temperature parameters $T_n$, different color rendering index $Ra_m$ and different average brightness $L_p$, and selecting a set of color temperature, color rendering index and average brightness as the light environmental parameters so as to set the light environment;

step (b): placing an non-coloured visual object in the tunnel middle section, wherein the visual object is a cube of which the side length is C, and selecting a plurality of drivers to be tested at a certain position in a tunnel middle section, the distance between the position of the visual object and the position of the tested driver is D, and the tested driver's visual height is H; after each tested driver puts on a dynamic eye movement device which has been calibrated, starting to record an eye movement video, blocking the tested driver's front scene with an obstruction, randomly placing the visual object, removing the obstruction, instructing the tested driver to start searching and visually recognize the visual object, stopping the video recording after the visual recognition is completed, and recording the visual recognition results.

In the practical tunnel test, the distance D between the position of the visual object and the starting point of the tunnel middle section is generally not less than the safe stopping sight distance $D_0$ at the maximum speed limit of the tunnel.

Step (c): resetting a different set of light environment parameters of color temperature, color rendering index and average brightness for the tunnel middle section, and repeating step (b) to obtain a plurality of drivers' related test information data and visual recognition results under multiple sets of different light environmental parameters.

Step (d): analysing the tested driver's dynamic eye movement video information acquired by the dynamic eye movement device to determine the number of frames in visual fixation points with which the driver captures the visual object, and determining visual recognition time of the driver observing and visually recognizing the object under different light environmental characteristics with the number of frames of the visual object, and establishing relationship analysis between the visual recognition time and the color temperature, the color rendering index and the brightness parameter of the light environment by correlating the visual recognition information data.

Step (e): performing a visual efficacy analysis by analysing the relationship between the visual recognition time and the color temperature, the color rendering index and the brightness parameter of the light environment, to obtain light environmental parameter guidance standards for improving the visual efficacy of non-coloured objects under certain combinations of the color temperature, color rendering index and light source brightness parameters. The data relationship curve of the visual recognition time corresponding to the color rendering index with different brightness under the same color temperature is obtained by processing the experimental data.

Visual studies shown that the color rendering of a light source is an important parameter to determine the color quality of the light source under different light sources. The color rendering of the light source is the characterization of the true degree of color reproduction, and the color rendering index CRI, which is numeral characterization of color rendering, is used as the quantitative evaluation index and represents the degree that the color of an object under the irradiation of the light source matches with the color exhibited of the object under the irradiation of a standard light source (sunlight), and the CIE sets the color rendering index of the sunlight at noon to be 100. The spectral radiant energy distribution of the light source determines the color rendering of the light source. The light source with continuous spectral distribution, wide spectral coverage range and spectral energy characteristics similar to the natural light has better color rendering. In the existing research standards at home and abroad, the color rendering index has been used as an important indicator of the true degree of color performance evaluation, the light source with good color rendering improves the visual reliability of coloured objects, while influence of visual efficacy on non-coloured objects is not studied. Being non-coloured refers to colors of white, gray, black and the like without color, non-coloured objects being white, gray, black and the like have equal light absorption on each wavelength of a white light spectrum, objects with a reflection ratio of 80-90% or more are white, objects with a reflection ratio of 4% or less are black, and those with a reflection of ratio of smaller than 80-90% or greater than 4% are different levels of gray, i.e., gray is between the black and white.

Studies on spectral components of natural light show that the color temperature distribution of natural light is in the range of 5000K to 6000K. Thus, in order to improve the validity and the universality of determined data, in a test of this embodiment, the selection of color temperature can be carried out in the extension of the range of the above-mentioned numerical values, for example, the value range of color temperature can be set between 3000K-6500K; from the perspective of visual recognition safety and comfort as well as operating cost reduction, the value range of color rendering index can be set between 50-100. The lighting environment brightness level is one of important parameters to evaluate the lighting quality of a tunnel.

Some international academic communities and countries in the world have different provisions on the value of brightness index adopted in lighting for the middle section. The following table is the basic lighting brightness table for the tunnel middle section by China's existing "Design Rules of Ventilation and Lighting for Road Tunnels" (JTG/T D70/2-01—2014):

TABLE 1

Basic Lighting Brightness Table for Middle Section Lin (cd/m$^2$)

| Design speed vt (km/h) | Lin | | |
|---|---|---|---|
| | One-way traffic | | |
| | N ≥1200 veh/(h · ln) | 350 veh/ (h · ln) < N < 1200 veh/(h · ln) | N ≤350 veh/ (h · ln) |
| | Two-way traffic | | |
| | N ≥650 veh/ (h · ln) | 180 veh/(h · ln) < N < 650 veh/ (h · ln) | N ≤180 veh/ (h · ln) |
| 120 | 10.0 | 6.0 | 4.5 |
| 100 | 6.5 | 4.5 | 3.0 |
| 80 | 3.5 | 2.5 | 1.5 |
| 60 | 2.0 | 1.5 | 1.0 |
| 20~40 | 1.0 | 1.0 | 1.0 |

In order to improve the validity and the universality of the measured data, the brightness value range of this embodiment is set between 1.0 cd/m$^2$ to 5 cd/m$^2$.

In order to make the visual efficacy determining method for non-coloured objects in different light environments provided the present invention more reliable and conform with international standards, in this embodiment of the lighting standard determining method for a tunnel middle section 100 based on the safety visual recognition, the used object 103 is a gray cube having the volume of about 20 cm×20 cm×20 cm and a reflectance of 20%. To eliminate the influence of driver's memory about the position of the object on the experimental results, the position of the visual object in the tunnel middle section 100 is set randomly, and in the setting process of the visual object, an obstruction (such as a black curtain) is arranged between the driver to be tested and the visual object.

In this embodiment, the setting of the light environment is carried out by using an adjustable lighting device, and an non-coloured object, a spectral radiation determining measuring device, a brightness measuring device, a dynamic eye movement measuring device and a distance measuring device used for testing, so that this embodiment is conveniently implemented. In order to make the determination results better conform to objective reality, in the visual efficacy determining method for non-coloured objects in different light environments of this embodiment, a plurality of drivers are selected, and the drivers are randomly selected persons at different age groups, with different normal eyesight levels and different driving ages.

According to the method of this embodiment, the relationship analysis between the driver's visual recognition time and the color temperature, color rendering index and brightness parameters of the light environment is established. Through experiments and analysis and processing of experimental data, guidance standards of light environment parameters, which effectively and reasonably conform to the objective visual efficacy of the drivers, are provided for the actual lighting of night roads and the lighting of tunnel middle sections.

Embodiment 2

As actual determination experiments can hardly be completed due to the influence of passing-by vehicles if tests are conducted in a tunnel middle section which has been actually used, in this embodiment, it is more practical to carry out the determination of the present invention by using a simulated tunnel middle section.

In this embodiment, the inventor builds an experimental environment with length, width and height of 60×3.8×3.8 m in a long corridor of a warehouse. In order to make the light source of the experimental environment controllable and free from the influence of reflection light from materials on top and side surfaces, the top surface, the left side surface and the right side surface of the experimental environment are covered with black cloth, and the ground is paved with modified asphalt waterproofing membranes which are diffuse reflection series materials similar to an asphalt concrete pavement.

In order to make the lighting light source controllable and convenient to operate, multiple light sources are selected for experiments, such as LED light sources which are commonly used in tunnels at current are used as experimental light sources. Studies on spectral components of natural light show that color temperature distribution similar to natural light is in the range of 5000K to 6000K. Thus, in order to improve the validity and the universality of measured data, light sources of which the color temperature parameters are at five color temperature levels (3000K, 4000K, 5000K, 5700K and 6500K) are selected as representative light sources in this experiment. From the perspective of visual recognition safety and comfort as well as operating cost reduction, four color rendering indexes (60, 70, 80 and 90) are selected as the color rendering indexes in this experiment. Experimental plans about these five color temperature levels and four color rendering indexes are designed, and fourteen different light sources are obtained in total, as shown in Table 2 below.

TABLE 2

| Color Temperature vs. Color Rendering Index Table of LED Light SourcesColor Temperature (k)Color Rendering Index | 3000 | 4000 | 5000 | 5700 | 6500 |
|---|---|---|---|---|---|
| 60 | ✓ | — | — | — | — |
| 70 | ✓ | ✓ | ✓ | ✓ | — |
| 80 | ✓ | ✓ | ✓ | ✓ | ✓ |
| 90 | ✓ | — | ✓ | ✓ | ✓ |

The lighting environment brightness level is one of important parameters to evaluate the lighting quality of a tunnel. The design speed of this experiment is 80 km/h, and the safe visual recognition distance is 110 m. According to the tunnel lighting design requirements (see Table 1), brightness values in the tunnel middle section are mostly 1.5 cd/m$^2$ to 3.5 cd/m$^2$. Therefore, in order to improve the validity and the universality of the measured data, eight brightness levels (1.5 cd/m$^2$, 2.0 cd/m$^2$, 2.5 cd/m$^2$, 3.0 cd/m$^2$, 3.5 cd/m$^2$, 4.0 cd/m$^2$, 4.5 cd/m$^2$ and 5 cd/m$^2$) are selected in this embodiment for determination.

This experiment involves human cognition. In order to avoid the influence of drivers which are different in genders, ages and characters on the experimental results, 10 males averagely aged between 26 and 50 years old and 2 females averagely aged between 26 and 50 years old are selected for this experiment, as shown in Table 3 below. According to the experimental purpose, 12 healthy drivers with no history of cardiovascular diseases, heart diseases and other major diseases are selected to be tested, and the drivers to be tested are required to have a binocular uncorrected visual acuity of 4.9 or more and have no color blindness, color weakness or other eye diseases. The drivers are required to have a good rest and normal reactions during the experiment. The drivers are required to be free of unfavorable conditions such as alcohol consumption and medication during the experiment.

TABLE 3

| Profiles of Tested Drivers | | | | | | |
|---|---|---|---|---|---|---|
| Sex | Male | | | | | Female |
| Age | 26-30 | 31-35 | 36-40 | 41-45 | 46-50 | About 34 | About 42 |
| Number | 2 | 2 | 2 | 2 | 2 | 1 | 1 |

In the experiment, the tested driver's visual height is the "eye height" H, referring to the height from the driver's eyes to the ground. In China's corresponding standards, the eye height defined according to a minibus with a low vehicle body, so the standard eye height $H_0$ is 1.2 m.

In tunnel lighting, the contrast of an object is a substantial factor for the human eye to recognize the obstruction. The brightness of the object and the brightness of the background constitute the contrast of the object; if the brightness of the object is close to the brightness of the background, visibility will be low no matter how high the brightness of the road surface is maintained, which will bring a risk to the traffic safety and thus is unfavorable. Having a high contrast, the object is easy to catch by human eyes. As gray objects have a low contrast with asphalt concrete pavements that often used in tunnels, a gray cube is used as the visual object according to the most unfavorable principle.

As obstructions on the road are mostly composed of irregular polyhedrons, the minimum height of a vehicle chassis to the ground changes within 0.10 and 0.20 m. The height of largest obstructions on the road causing vehicles to overturn is 18 cm, so drivers must take dodge measures to bypass when the height of the obstruction is greater than 18 cm. The visual object selected in this embodiment is a gray cube having a size of 20 cm×20 cm×20 cm and a surface reflection coefficient of 0.2 as recommended by the Commission Internationale de L'Eclairage (CIE) as a reference for evaluating the drivers' safe visual recognition. Actual traffic obstructions may vary in color or size, but research has shown that objects based on this standard will be suitable for determination and evaluation of various different lighting environments. Therefore, in this embodiment, the above-mentioned gray cube of 20 cm×20 cm×20 cm is used, i.e., the visual object with a standard side length C0 of 20 cm is used as a standard visual object for evaluating light visibility factors of the tunnel.

In this embodiment, the selected tunnel has a maximum speed limit of 80 km/h and a safe stopping sight distance D0 of 110 m, and as the experimental site has an actual effective distance D of 45 m and cannot provide an enough observation distance, according to the principle of retinal imaging, the size of the object and the tested drivers' eye heights for visual recognition are proportionally reduced to obtain the drivers' actual eye heights and the size of the object, as shown in Table 4.

TABLE 4

Conversion for Size of Experiment Object and Eye Height for Visual Recognition

| | Visual recognition distance | Size of Object (cm) | Eye Height for Visual Recognition |
|---|---|---|---|
| 80 km/h Stopping Sight Distance | 110 m | 20 cm × 20 cm × 20 cm | 1.2 m |
| Size after Conversion | 45 m | 8.2 × 8.2 × 8.2 cm | 0.49 m |

As shown in Table 4, when the visual recognition distance D in the simulated tunnel middle section is 45 m, the driver's visual height is 0.49 m, and the size of the visual object is 8.2 cm×8.2 cm×8.2 cm. During the test, the drivers take a posture of lying-sitting on the ground to have the test.

Figure 2:
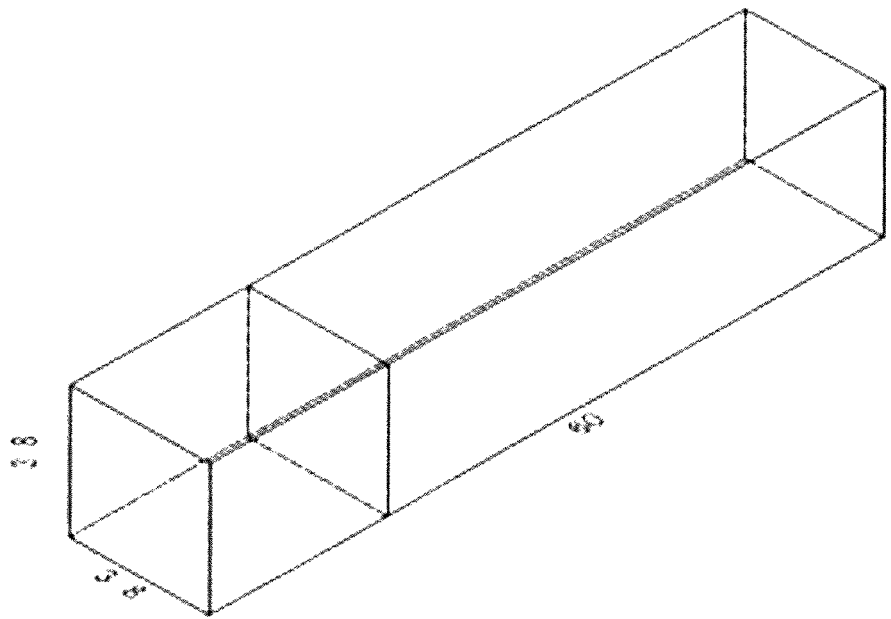
FIG. 2 is a schematic diagram of a simulated tunnel middle section.

In the simulated tunnel middle section as shown in FIG. 2, the light environment of the simulated tunnel middle section is very similar to that of an actual tunnel middle section by the above-mentioned setting of the light environment and the test environment for the simulated tunnel middle section.

In order to carry out the test on the simulated tunnel middle section under different light environment parameters, lighting devices of multiple light source characteristics can be mounted in the simulated tunnel middle section; for example, one of a dozen of different lighting light sources can be selected and mounted according to experimental needs. Parameter values of the color temperature, the color rendering index and the average brightness of the set light environment are determined by color temperature, color rendering index and brightness measuring devices, for example a luminance spectrophotometer and a color luminance meter are used for measuring parameters of the color rendering index, brightness, chromaticity, relevant color temperature and the like. Through debugging, the lighting device can generate a uniform light color environment to achieve the light environment parameter values required by the experiment. The positions of the driver and the object are determined, the driver's eye height is adjusted to 0.49 m, the color temperature and the color rendering index of the position where the objected is placed are measured by using the spectrophotometer (according to the actual experimental conditions), and the brightness of the position where the object is placed is measured by using the luminance meter; the tested driver puts on an ETG eye tracker, and after the ETG eye tracker is calibrated (by a five point calibration method), video recording is started; the staff blocks the driver's front scene with a black curtain, the visual object is blocked and then the black curtain removed, meanwhile the tested driver begins to visually recognize the object, and video recording is stopped after the end of visual recognition, and then the driver is asked to answer the following questions: (1) if there is an object; (2) the shape of the object; and (3) the color of the object. Then, the above experimental processes are repeated, until all drivers finish visual recognition; the next set of light source is mounted, the light environmental parameters are reset, and the above experimental processes are repeated, until the tests with all of the designed 14 light sources are completed.

In order to increase the sample quantity to improve the accuracy and the validity of the measured data, experiments are repeated on different drivers in the same experimental environment to eliminate the drivers' individual differences. The total sample quantity of the experiment is 1308.

In this embodiment, the selected dynamic eye tracker has a data acquisition frequency of 30 Hz, i.e. the eye movement data is acquired every 20 ms; the eye movement capturing range is ±35° in the horizontal direction and ±27.5° in the vertical direction; eye movement tracking resolution is 0.1°; accuracy of vision focus is 0.5°-1.0° (at all distances). The information of the driver's visual fixation points can be dynamically recorded during visual recognition. Through the information of the driver's visual recognition of the visual object acquired by the eye tracker, the number of frames in the driver's visual fixation points with which the driver captures the visual object can be analysed and determined so as to determine visual recognition time by conversion.

Digital cameras, digital video cameras and other equipment are also used in the experiments to shoot necessary scenes during the experiments to provide a necessary information support for later data analysis.

By analysing the video information acquired by the eye tracker, the number of frames (visual recognition time) in the driver's visual fixation points with which the driver captures the visual object can be determined and used to determine the visual recognition time of the driver's visual recognition of the visual object under different light environmental characteristics. Through statistics and collection of experimental data, and by using MATLAB software for processing, a data relationship curve of the visual recognition time corresponding to the color rendering index with different brightness under the same color temperature is obtained, as shown in FIG. 4 to FIG. 7, which show data relationship curves of visual recognition time, color rendering index and average brightness under color temperature values of 3000K, 4000K, 5000K, 5700K and 6500K, respectively.

The relationship curves shown in FIG. 4 to FIG. 7 and the changing trends in the data relationship curves of this embodiment show that when the color temperature of the light source is 3000K, 4000K, 5000K, 5700K and 6500K, as the color rendering index of the light source increases from 70, 80 to 90, the visual recognition time of the object becomes shorter, i.e. a light source with a high color rendering index can improve the visual efficacy on the gray object. The analysis shows that, the visual efficacy of non-coloured objects can be improved by improving the color rendering of the light source without changing the brightness level or the color temperature of the light source i.e., the visual brightness of the non-coloured object is improved.

Embodiment 3

The present invention further provides a system for implementing a visual efficacy determining method for non-coloured objects in different light environments, wherein the system comprises: a simulated tunnel middle section subsystem, comprising an adjustable lighting device mounted in the tunnel middle section, wherein light absorbing materials are arranged on the top surface, the left side surface and the right side surface of the simulated tunnel, obstructions for blocking visions are arranged in the simulated tunnel, and diffuse reflection materials similar to an actual road surface are arranged on the road surface of the simulated tunnel so as to create a light environment and testing environment; a testing subsystem, comprising an non-coloured object, a spectral radiation measuring device, a brightness measuring device, a dynamic eye movement measuring device and a distance measuring device for performing testing, collecting test data and results; and a data processing subsystem, comprising a computer system for fitting and processing the test data.

The adjustable lighting device of the simulated tunnel middle section subsystem is a power-adjustable lighting light source arranged at the top of the simulated tunnel; light absorbing materials arranged on the top surface, the left side surface and the right side surface of the simulated tunnel are black decorative materials; the obstruction is a black curtain; the diffuse reflection materials arranged on the road surface similar to an actual road surface are modified asphalt waterproofing membranes; in the testing subsystem, the non-coloured object is a gray cube with a reflectivity of 20%; the spectral radiation measuring device is a luminance spectrophotometer; the brightness measuring device is a color luminance meter; and the dynamic eye movement measuring device is a dynamic eye tracker. The selected dynamic eye tracker has a data acquisition frequency of 30 Hz, i.e., the eye movement data is acquired every 20 ms; the eye movement capturing range is ±35° in the horizontal direction and ±27.5° in the vertical direction; eye movement tracking resolution is 0.1°; and accuracy of vision focus is 0.5°-1.0°. The information of the driver's visual recognition of the visual object can be dynamically recorded for determining the time required by the driver to capture the fixation points of the object, and the side length of the cubic object is less than or equal to 20 cm.

The lighting device in the system of this embodiment is a lighting device with controllable color temperature, color rendering index and brightness, and is flexible and convenient in setting of the light environment. In the measurement of the light environmental parameter values, in order to perform convenient measurement, the color temperature measuring device and the color rendering index measuring device are the same, namely the luminance spectrophotometer. The brightness measuring device in the system can be a color luminance meter or an illuminance meter. The brightness value can be obtained according to the relationship between illuminance and brightness. For example, the road average brightness value and the average illumination value are measured first, then the road average illuminance conversion coefficient can be calculated, and this coefficient can be used for the conversion ratio relationship between illumination and brightness, so that the brightness can be obtained by determining the illumination.

Through the visual efficacy determining method for non-coloured objects in different light environments and the system thereof, guidance standards of light environmental parameters, which effectively and reasonably conform to the objective visual efficacy of the drivers, are provided for the actual lighting of the night road and the tunnel middle section.

The invention claimed is:

1. A visual efficacy determining method for non-coloured objects in different light environments, comprising the following steps:
   (a) setting light environmental parameters of a tunnel middle section, wherein the tunnel is a simulated tunnel, the light environmental parameters include color temperature T, color rendering index R and average brightness L, selecting and setting a set of color temperature T, color rendering index R and average brightness L as the light environmental parameters;
   (b) placing a non-coloured visual object in the tunnel middle section, wherein the visual object is a cube of which the side length is C, and selecting a plurality of drivers to be tested at a certain position in the tunnel middle section, the distance between the position of the visual object and the position of the tested driver is D, and the tested driver's visual height is H; the visual object is a grey cube with a surface reflection coefficient of 0.2, with the safe stopping sight distance of $D_0$ at a tunnel maximum speed limit, if the side length of the visual object is $C_0$=20 cm and the driver's visual recognition height is a passenger car driver's standard sitting height $H_0$=1.2 m, then the distance D from the visual object to the tested driver's starting position, the side length C of the visual object, the tested driver's visual recognition height H, the safe stopping sight distance $D_0$, the standard side length $C_0$ of the object and the standard visual height $H_0$ shall meet the conversion ratio relationship of $D:C:H=D_0:C_0:H_0$; and after each tested driver puts on a dynamic eye movement device which has been calibrated, starting to record an eye movement video, blocking the tested driver's front scene with an obstruction, randomly placing the visual object, removing the obstruction, instructing the tested driver to start searching and visually recognize the visual object, stopping the video recording after the visual recognition is completed, and recording the visual recognition results;
   (c) resetting a different set of light environmental parameters of color temperature, color rendering index and average brightness for the tunnel middle section, and repeating step (b) to obtain a plurality of drivers' related test information data and results under multiple sets of different light environmental parameters;
   (d) analysing the tested driver's dynamic eye movement video acquired by the dynamic eye movement device to determine the number of frames in visual fixation points with which the driver captures the visual object, and determining visual recognition time of the driver visually recognizing the object under different light environmental characteristics with the number of frames of the visual object, and establishing a relationship analysis between the visual recognition time and the color temperature, the color rendering index and the brightness parameter of the light environment by correlating the visual recognition information data, wherein a relationship between the visual recognition time and the color temperature, the color rendering index and the brightness parameter of the light environment is established to obtain data relationship curves of the visual recognition time corresponding to the color rendering index with different brightness under the same color temperature;
   (e) performing a visual efficacy analysis by analysing the relationship between the visual recognition time and the color temperature, the color rendering index and the brightness parameter of the light environment, to obtain light environmental parameter standards for improving the visual efficacy of non-coloured objects under certain combinations of the color temperature, color rendering index and light source brightness parameters.

2. The visual efficacy determining method for non-coloured objects in different light environments of claim 1, wherein: the values of the light environment parameters range as follows: the color temperature ranges from 3000K to 6500K, the color rendering index ranges from 50 to 100, and the brightness ranges from 1.0 cd/m² to 10 cd/m².

3. The visual efficacy determining method for non-coloured objects in different light environments of claim 1, wherein: the color temperature parameter values are selected to be 3000K, 4000K, 5000K, 5700K and 6500K, the color rendering index values are selected to be 60, 70, 80 and 90, and the brightness parameter values are selected to be 1.5 cd/m$^2$, 2.0 cd/m$^2$, 2.5 cd/m$^2$, 3.0 cd/m$^2$, 3.5 cd/m$^2$, 4.0 cd/m$^2$, 4.5 cd/m$^2$ and 5 cd/m$^2$.

4. The visual efficacy determining method for non-coloured objects in different light environments of claim 1, wherein: the position of the visual object in the tunnel middle section is set randomly; the driver's front scene is blocked with a black curtain, the visual object is placed and then the black curtain is removed, meanwhile the tested driver is asked to begin to visually recognize the object, eye movement video recording is stopped after the end of visual recognition, and then the driver is asked to give his/her visual recognition results about the following questions: (1) if there is an object; (2) the shape of the object; and (3) the color of the object.

5. The visual efficacy determining method for non-coloured objects in different light environments of claim 1, wherein: the tested drivers are randomly selected persons at different age groups, with different normal eyesight levels and different driving ages; and experiments are repeated on different drivers in the same experimental environment to eliminate the drivers' individual differences.

6. The visual efficacy determining method for non-coloured objects in different light environments of claim 5, wherein: the data relationship curve of the visual recognition time corresponding to the color rendering index with different brightness under the same color temperature is obtained by processing and analysis of experimental data and results, to come out with a conclusion that the visual efficacy of the non-coloured object can be improved by increasing the color rendering of the light source without changing the brightness level or the color temperature of the light environment.

7. A system for implementing a visual efficacy determining method for non-coloured objects in different light environments, comprising:

a simulated tunnel middle section subsystem, comprising an adjustable lighting device mounted in a tunnel middle section, wherein light absorbing materials are arranged on the top surface, the left side surface and the right side surface of the simulated tunnel, obstructions for blocking visions are arranged at the simulated tunnel middle section, and diffuse reflection materials similar to an actual road surface are arranged on the road surface of the simulated tunnel, so as to create a light environment and testing environment, the adjustable lighting device of the simulated tunnel middle section subsystem is a power-adjustable lighting light source arranged at the top of the simulated tunnel, light absorbing materials arranged on the top surface, the left side surface and the right side surface of the simulated tunnel are black materials, the obstruction is a black curtain, the diffuse reflection materials arranged on the road surface similar to an actual road surface are modified asphalt waterproofing membranes;

a testing subsystem, comprising a non-coloured object, a spectral radiation measuring device, a brightness measuring device, and a dynamic eye movement measuring device for performing testing and collecting test data and results, wherein the non-coloured object is a grey cube with a reflectivity of 20%, the spectral radiation measuring device is aluminance spectrophotometer, the brightness measuring device is a color luminance meter, and the dynamic eye movement measuring device is a dynamic eye tracker; and a data processing subsystem, comprising a computer system for fitting and processing the test data.

8. The system of claim 7, wherein, in the testing subsystem, the dynamic eye tracker has a data acquisition frequency of 30 Hz, i.e., the eye movement data is acquired every 20 ms; the eye movement capturing range is ±35° in the horizontal direction and ±27.5° in the vertical direction; eye movement tracking resolution is 0.1°; and accuracy of vision focus is 0.5°-1.0°, the information of the driver's visual recognition of the visual object can be dynamically recorded for determining the time required by the driver to capture the fixation points of the object, and the side length of the cubic object is less than or equal to 20 cm.

* * * * *